(12) United States Patent
Nishihara et al.

(10) Patent No.: US 12,252,809 B2
(45) Date of Patent: Mar. 18, 2025

(54) SiC SUBSTRATE AND SiC EPITAXIAL WAFER

(71) Applicant: Resonac Corporation, Tokyo (JP)

(72) Inventors: Yoshitaka Nishihara, Tokyo (JP); Hiromasa Suo, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/143,665

(22) Filed: May 5, 2023

(65) Prior Publication Data

US 2024/0003053 A1 Jan. 4, 2024

(30) Foreign Application Priority Data

May 31, 2022 (JP) ................................ 2022-089091

(51) Int. Cl.
*C30B 29/36* (2006.01)
*C01B 32/956* (2017.01)
*H01L 29/16* (2006.01)

(52) U.S. Cl.
CPC ............ *C30B 29/36* (2013.01); *C01B 32/956* (2017.08); *H01L 29/1608* (2013.01)

(58) Field of Classification Search
None
See application file for complete search history.

(56) References Cited

U.S. PATENT DOCUMENTS

2021/0198804 A1* 7/2021 Khlebnikov .......... C30B 23/066

FOREIGN PATENT DOCUMENTS

| JP | 2012-182234 A | 9/2012 |
| JP | 2021-102533 A | 7/2021 |
| WO | 2020/236246 A1 | 11/2020 |

* cited by examiner

*Primary Examiner* — Jeffrey D Washville
(74) *Attorney, Agent, or Firm* — Sughrue Mion, PLLC

(57) ABSTRACT

In a SiC substrate of the present invention, in a case where the SiC substrate is supported on an inner periphery by an inner peripheral support surface positioned to overlap a circumference having a radius of 17.5 mm from a center, in a case where a plane connecting first points of an upper surface overlapping the inner peripheral support surface when seen in a thickness direction is defined as a first reference plane, and an upper side of the first reference plane is defined as a positive side, a bow is less than 40 μm.

16 Claims, 7 Drawing Sheets

SiC SUBSTRATE AND SiC EPITAXIAL WAFER

BACKGROUND OF THE INVENTION

Field of the Invention

The present invention relates to a SiC substrate and a SiC epitaxial wafer.

Description of Related Art

Silicon carbide (SiC) has a dielectric breakdown field one order of magnitude larger and a bandgap three times larger than silicon (Si). In addition, silicon carbide (SiC) has a property such as a thermal conductivity that is about three times as high as that of silicon (Si). Therefore, silicon carbide (SiC) is expected to be applied to power devices, high-frequency devices, high-temperature operation devices, and the like. Thus, in recent years, SiC epitaxial wafers have come to be used for such semiconductor devices.

A SiC epitaxial wafer is obtained by stacking a SiC epitaxial layer on a surface of a SiC substrate cut out from a SiC ingot. Hereinafter, a substrate before stacking the SiC epitaxial layer is referred to as the SiC substrate, and a substrate after stacking the SiC epitaxial layer is referred to as a SIC epitaxial wafer.

A SiC substrate or a SiC epitaxial wafer may deflect during a process such as transportation. The deflection may cause defects such as sensor detection failure or adsorption failure. For example, Patent Document 1 discloses that deflection during transportation is suppressed by performing outer peripheral support of a SiC substrate warped so that a center is above an outer side. In addition, Patent Document 2 discloses that a wafer is supported on a flat surface by a support to suppress unevenness during a heat process so that deflection does not occur.

CITATION LIST

Patent Document

Patent Document 1

United States patent application, Publication No. 2021/0198804

Patent Document 2

Japanese Unexamined patent application, First Publication No. 2012-182234

SUMMARY OF THE INVENTION

There are various methods of supporting a wafer, and there may be restrictions in relation to other configurations. The methods described in Patent Document 1 and Patent Document 2 can suppress the occurrence of defects in a case of a method for supporting a specific wafer, but the defects cannot be sufficiently reduced, for example, in a case of supporting the wafer on its inner periphery.

The present invention has been made in view of the above problems, and an object of the present invention is to provide a SiC substrate and a SiC epitaxial wafer in which defects are less likely to occur.

The present inventors have found that the defects during transportation can be reduced by manufacturing a SiC substrate in which a bow and a warp, that define a shape or deflection of a wafer, are in predetermined ranges, and using the SiC substrate. That is, the present invention provides the following means in order to solve the above problems.

(1) In a SiC substrate according to a first aspect, in a case where the SiC substrate is supported on an inner periphery by an inner peripheral support surface positioned to overlap a circumference having a radius of 17.5 mm from a center, in a case where a plane connecting first points of an upper surface overlapping the inner peripheral support surface when seen in a thickness direction is defined as a first reference plane, and an upper side of the first reference plane is defined as a positive side, a bow is less than 40 µm.

(2) The SiC substrate according to the aspect described above, a warp in a case where the SiC substrate is supported by the inner peripheral support surface may be less than 60 µm.

(3) In the SiC substrate according to the aspect described above, in a case where the SiC substrate is supported on an outer periphery by an outer peripheral support surface positioned to overlap a circumference 7.5 mm inside from an outermost periphery, in a case where a plane connecting second points of the upper surface overlapping the outer peripheral support surface when seen in the thickness direction is defined as a second reference plane, and an upper side of the second reference plane is defined as a positive side, a bow may be more than −40 µm.

(4) In the SiC substrate according to the aspect described above, in a case where the SiC substrate is supported on the outer periphery by the outer peripheral support surface, a bow with respect to the second reference plane may be 0 µm or less.

(5) The SiC substrate according to the aspect described above, a warp in a case where the SiC substrate is supported by the outer peripheral support surface may be less than 60 µm.

(6) The SiC substrate according to the aspect described above may have a diameter of 145 mm or more.

(7) The SiC substrate according to the aspect described above may have a diameter of 195 mm or more.

(8) A SiC epitaxial wafer according to a second aspect includes the SiC substrate according to the aspect described above, and a SiC epitaxial layer stacked on one surface of the SiC substrate.

In the SiC substrate and the SiC epitaxial wafer according to the aspect described above, defects are less likely to occur.

DETAILED DESCRIPTION OF THE INVENTION

Figure 1:
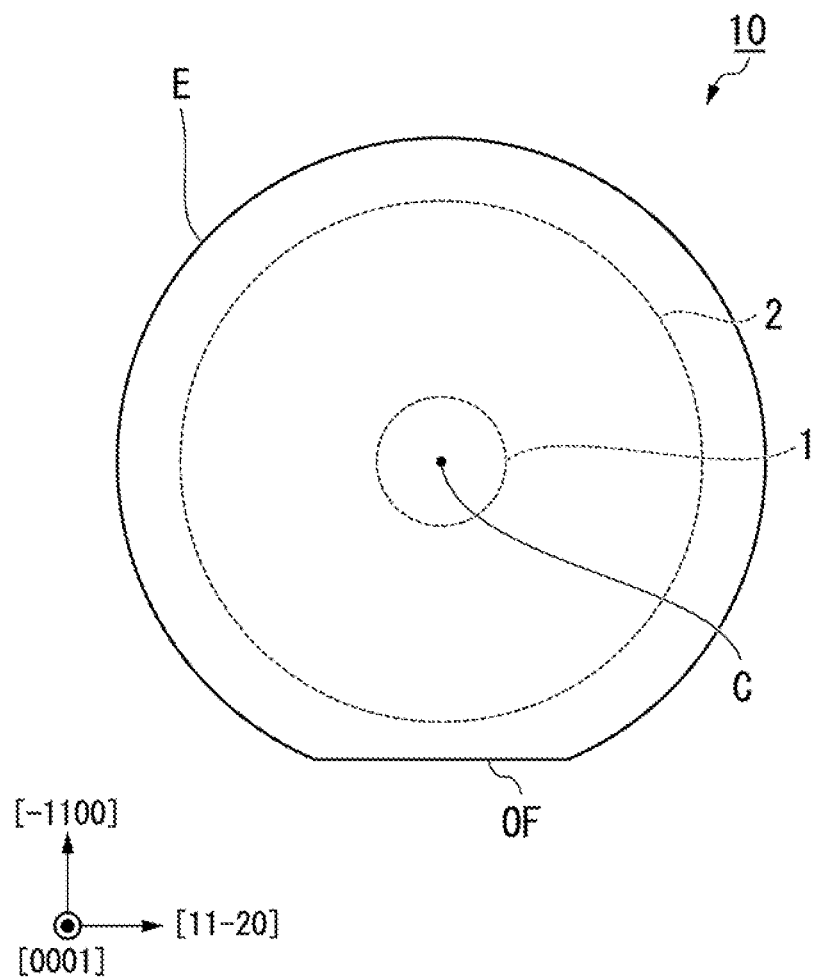
FIG. 1 is a plan view of a SiC substrate according to the present embodiment.

Hereinafter, a SiC substrate and the like according to the present embodiment will be described in detail with appropriate reference to the drawings. In the drawings used in the following description, characteristic parts may be enlarged for the sake of convenience in order to make it easier to understand the characteristics of the present embodiment, and dimensional ratios of constituent elements or the like may differ from the actual ones. Materials, dimensions, and the like in the following description are merely exemplary examples, and the present invention is not limited thereto and can be modified as appropriate without changing the gist of the invention.

First Embodiment

FIG. 1 is a plan view of a SiC substrate 10 seen in a plan view in a thickness direction of the SiC substrate 10 according to the present embodiment. The SiC substrate 10 is formed of SiC. A polytype of the SiC substrate 10 is not particularly limited and may be any of 2H, 3C, 4H, and 6H. The SiC substrate 10 is, for example, 4H-SiC.

A planar view shape of the SiC substrate 10 is substantially circular. The SiC substrate 10 may have an orientation flat OF or a notch for determining a direction of a crystal axis. A diameter of the SiC substrate 10 is, for example, 145 mm or more, and preferably 195 mm or more. The larger the diameter of the SiC substrate 10, the larger the absolute amount of deflection even with the same curvature. A SiC epitaxial wafer with large deflection has a great influence on subsequent steps, and it is required to suppress the deflection. In other words, the larger the diameter of the SiC substrate 10 that satisfies the configuration of the present invention, the more useful it is.

The SiC substrate 10 may be supported on its inner periphery or supported on its outer periphery during a process such as transportation. The inner periphery support is a method for supporting the SiC substrate 10 by an inner peripheral support surface 1 in the vicinity of a center C of the SiC substrate 10, and the outer peripheral support is a method for supporting the SiC substrate 10 by an outer peripheral support surface 2 in the vicinity of an outermost periphery E of the SiC substrate 10.

A position of the inner peripheral support surface 1 is not limited to a single position, and is, for example, a position overlapping a circumference having a radius of 17.5 mm from the center C. The inner peripheral support surface 1 may be an annular support surface positioned to overlap the circumference having a radius of 17.5 mm from the center C, or may be a plurality of support surfaces scattered along the circle. The inner peripheral support surface 1 is an upper surface of the support.

A position of the outer peripheral support surface 2 is not limited to a single position, and is, for example, a position overlapping a circumference 7.5 mm inside from the outermost periphery E. The outer peripheral support surface 2 may be an annular support surface positioned to overlap the circumference 7.5 mm inside from the outermost periphery E, or may be a plurality of support surfaces scattered along the circle. The outer peripheral support surface 2 is the upper surface of the support. For example, in a case where a diameter of the SiC substrate 10 is 150 mm, the outer peripheral support surface 2 is positioned to overlap a circumference having a radius of 67.5 mm from the center C. For example, in a case where a diameter of the SiC substrate 10 is 200 mm, the outer peripheral support surface 2 is positioned to overlap a circumference having a radius of 92.5 mm from the center C. For example, in a case where the diameter of the SiC substrate 10 is 300 mm, the outer peripheral support surface 2 is positioned to overlap a circumference having a radius of 142.5 mm from the center C. For example, in a case where a diameter of the SiC substrate 10 is 450 mm, the outer peripheral support surface 2 is positioned to overlap a circumference having a radius of 217.5 mm from the center C.

In a case where the SiC substrate 10 according to the present embodiment is supported on its inner periphery by the inner peripheral support surface 1 positioned to overlap the circumference having a radius of 17.5 mm from the center C, a bow is less than 40 µm, preferably 20 µm or less, and more preferably 10 µm or less. In a case where the bow of the inner peripheral support satisfies the above range, a transport error can be reduced. The transport error is, for example, sensor detection failure, adsorption failure, contact with other members, or the like.

Figure 2:
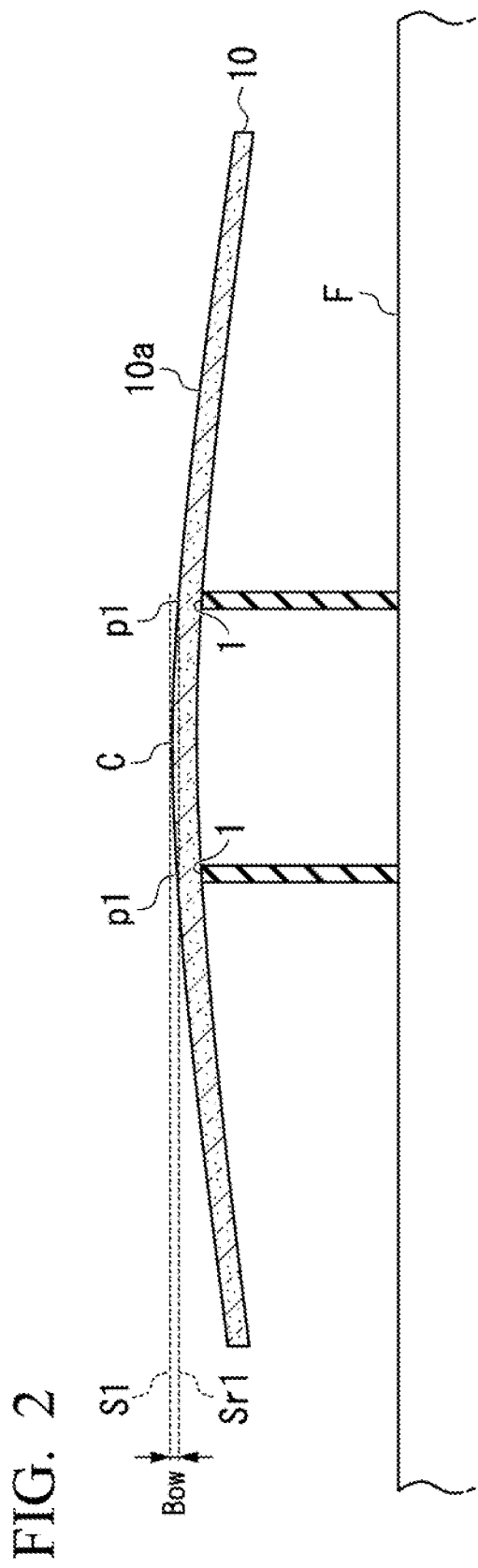
FIG. 2 is a cross-sectional view showing a method for evaluating a bow in a case where a SiC substrate is supported on an inner periphery according to the present embodiment.

FIG. 2 is a cross-sectional view showing a method for evaluating a bow in a case where the SiC substrate 10 is supported on an inner periphery according to the present embodiment. As shown in FIG. 2, in a case where the SiC substrate 10 is supported on the inner periphery by the inner peripheral support surface 1, the center C of the SiC substrate 10 is positioned farther from a flat surface F than the outermost periphery. That is, the SiC substrate 10 deflects upward when it is supported on the inner periphery.

The bow measures a height of the center C of the wafer and this height is defined as a signed distance to 3-point reference flat plane. In a case where it is above the 3-point reference flat plane, it is positive, and in a case where it is below it, it is negative. A reference plane for the inner peripheral support is referred to as a first reference plane Sr1. The first reference plane Sr1 is a plane connecting first points p1 of the upper surface 10a overlapping the inner peripheral support surface 1 when seen in the thickness direction. The first point p1 is, for example, a part that overlaps the inner peripheral support surface 1 when seen in the thickness direction. There are a plurality of first points p1 in a case where there are a plurality of inner peripheral support surfaces 1. For example, the first reference plane Sr1 is a plane connecting the plurality of first points p1. The bow in a case of the inner peripheral support is obtained as a position of the center C of the upper surface 10a in a height direction with respect to the first reference plane Sr1. An absolute value of the bow in a case of the inner peripheral support is obtained as a distance between a first plane S1 which passes through the center C and is parallel to the first reference plane Sr1 (the flat surface F) and a 3-point reference flat plane (the first reference plane Sr1).

The SiC substrate 10 according to the present embodiment has a warp in a case of the inner peripheral support is preferably 60 µm or less, more preferably 30 µm or less, and even more preferably 20 µm or less.

Figure 3:
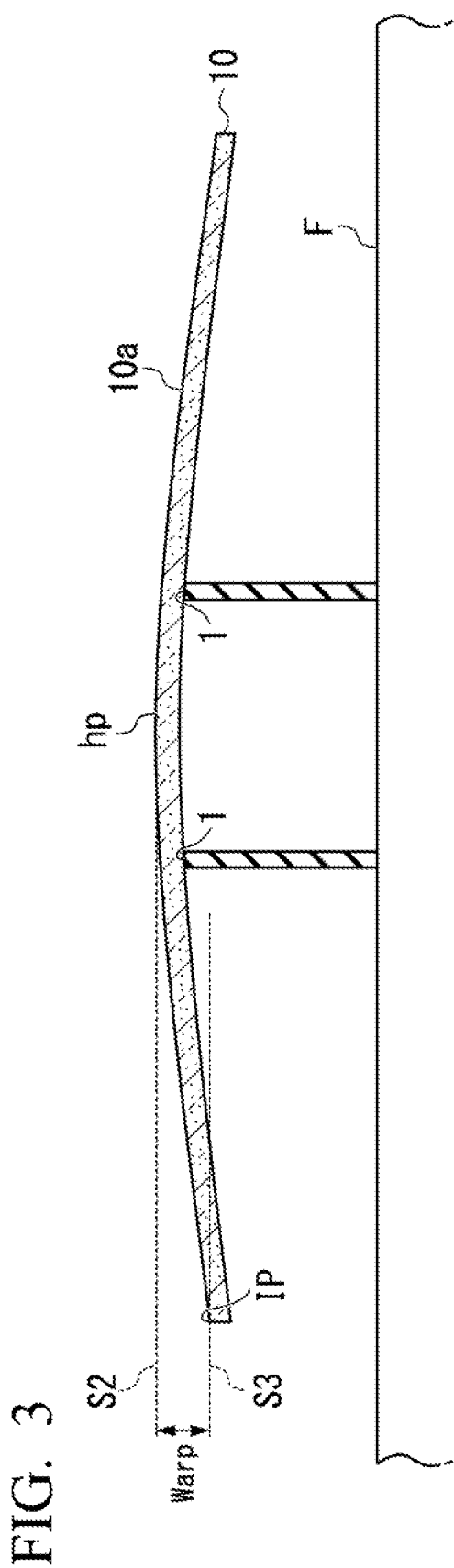
FIG. 3 is a cross-sectional view showing a method for evaluating a warp in a case where a SiC substrate is supported on an inner periphery according to the present embodiment.

FIG. 3 is a cross-sectional view showing a method for evaluating a warp in a case where the SiC substrate 10 is supported on an inner periphery according to the present embodiment.

The warp is a sum of distances from the 3-point reference flat plane to a highest point hp and a lowest point lp of the upper surface 10a and is always a positive value. The warp is obtained, for example, as a distance between a second plane S2 which passes through the highest point hp and is parallel to the 3-point reference flat plane (the first reference plane Sr1) (the flat surface F), and a third plane S3 which passes through the lowest point lp and is parallel to the 3-point reference flat plane (the first reference plane Sr1) (the flat surface F). In a case of the inner peripheral support, the highest point hp may coincide with the center C, and in this case, the first plane S1 and the second plane S2 coincide. It is determined that the larger the warp is, the more the SiC substrate 10 is deformed.

The SiC substrate 10 according to the present embodiment has a bow in a case of the outer peripheral support is preferably more than −40 μm, more preferably 0 μm or less, and even more preferably −20 μm or more and −5 μm or less. The bow greater than −40 μm means that an absolute value is smaller than 40 μm.

If the bow in a case of the outer peripheral support is within the above range, the transport errors can be suppressed in both cases where the SiC substrate 10 is supported on the inner periphery and supported on the outer periphery. That is, the SiC substrate having the bow in a predetermined range in both cases of the inner peripheral support and the outer peripheral support hardly causes the transport errors and has high versatility, for example, even during a transport process in which the support method needs to be changed during the transportation. In addition, in a device with automatic transportation, when transporting a wafer on a stage, the wafer is lifted by a push-up pin or the like, and a robot hand enters a gap thereof and lifts the wafer to transport the wafer. In a case where the bow is not in the predetermined range, the robot hand may collide with the wafer, or the wafer may not be within a stroke range of the robot hand, causing transport failure.

Figure 4:
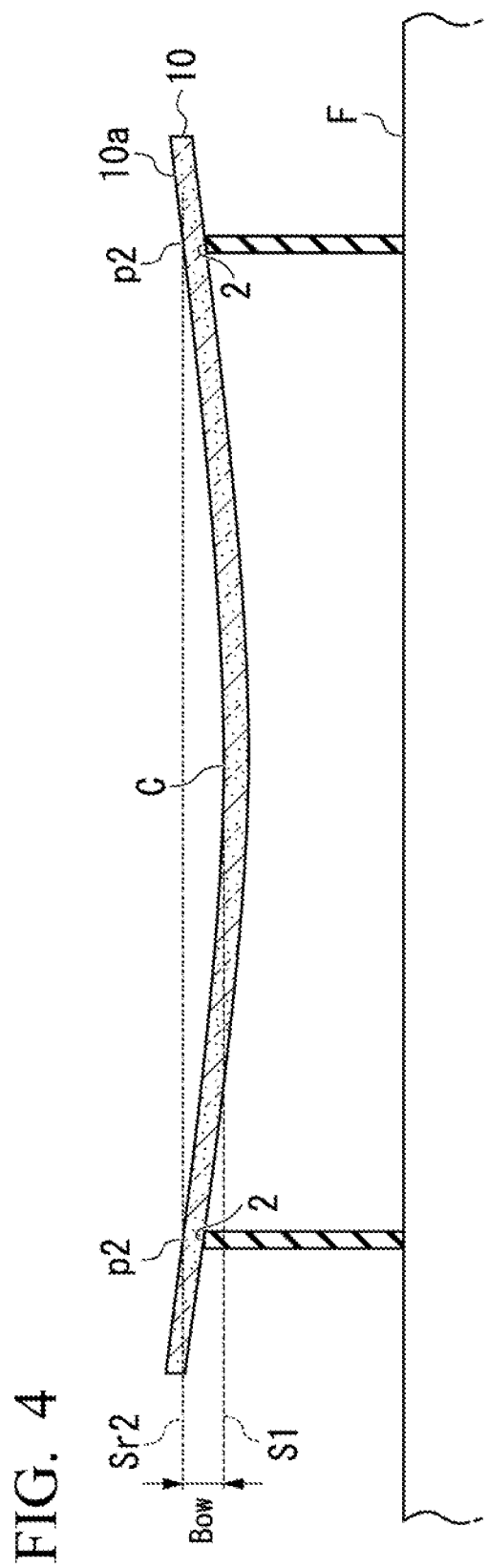
FIG. 4 is a cross-sectional view showing a method for evaluating a bow in a case where a SiC substrate is supported on an outer periphery according to the present embodiment.

FIG. 4 is a cross-sectional view showing a method for evaluating a bow in a case where the SiC substrate 10 is supported on an outer periphery according to the present embodiment. As shown in FIG. 4, in a case where the SiC substrate 10 is supported on the outer periphery by the outer peripheral support surface 2, the center C of the SiC substrate 10 is, for example, positioned closer to the flat surface F than the outermost periphery. That is, the SiC substrate 10, for example, deflects downward when it is supported on the outer periphery.

A reference plane for the outer peripheral support is referred to as a second reference plane Sr2. The second reference plane Sr2 is a plane connecting second points p2 of the upper surface 10a overlapping the outer peripheral support surface 2 when seen in the thickness direction. The second point p2 is, for example, a part that overlaps a center of the outer peripheral support surface 2 in a radial direction when seen in the thickness direction. There are a plurality of second points p2 in a case where there are a plurality of outer peripheral support surfaces 2. The second reference plane Sr2 is, for example, a plane connecting the plurality of second points p2. The bow in a case of the outer peripheral support is obtained as a position of the center C of the upper surface 10a in a height direction with respect to the 3-point reference flat plane (the second reference plane Sr2). An absolute value of the bow in a case of the outer peripheral support is obtained as a distance between a first plane S1 which passes through the center C and is parallel to the second reference plane Sr2 (the flat surface F) and the 3-point reference flat plane (the second reference plane Sr2).

Figure 5:
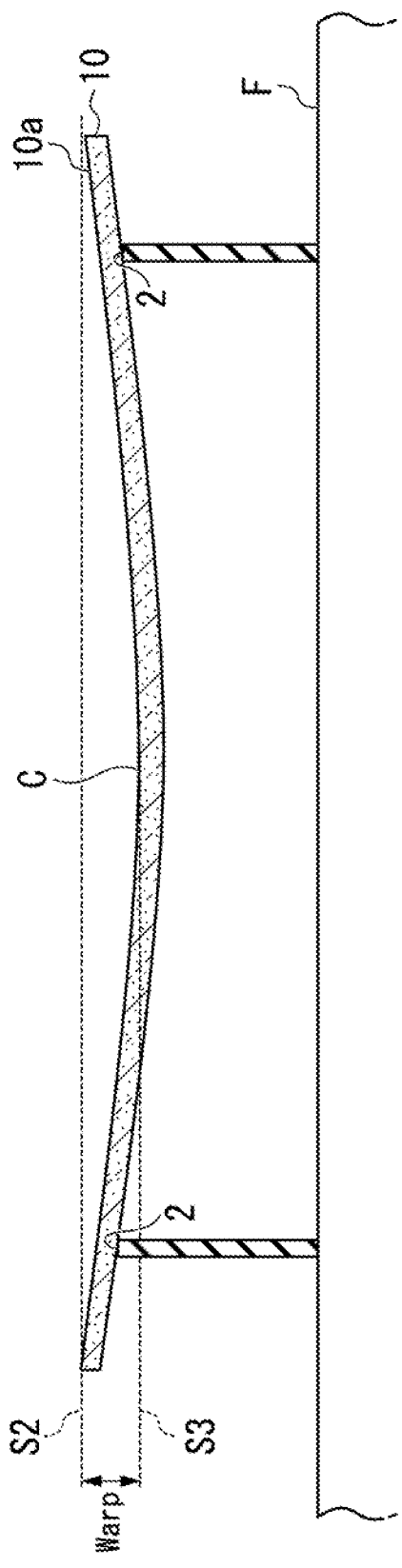
FIG. 5 is a cross-sectional view showing a method for evaluating a warp in a case where a SiC substrate is supported on an outer periphery according to the present embodiment.

FIG. 5 is a cross-sectional view showing a method for evaluating a warp in a case where the SiC substrate 10 is supported on an outer periphery according to the present embodiment.

As described above, the warp is a sum of distances from the 3-point reference flat plane to a highest point hp and a lowest point lp of the upper surface 10a. The warp is obtained, for example, as a distance between a second plane S2 which passes through the highest point hp and is parallel to the 3-point reference flat plane (the second reference plane Sr2) (the flat surface F), and a third plane S3 which passes through the lowest point lp and is parallel to the 3-point reference flat plane (the second reference plane Sr2) (the flat surface F). In a case of the outer peripheral support, the lowest point lp may coincide with the center C, and in this case, the first plane S1 and the third plane S3 coincide.

The bow and the warp of the SiC substrate 10 in a case of the inner peripheral support and a case of the outer peripheral support are affected by strain occurring in the SiC substrate 10 itself and deflection occurring in the SiC substrate 10 due to gravity. The strain occurring in the SiC substrate 10 itself is caused by an internal stress, for example. The strain occurring in the SiC substrate 10 itself can be controlled during the manufacturing process.

Next, an example of a method for manufacturing the SiC substrate 10 according to the present embodiment will be described. The SiC substrate 10 is obtained by slicing a SiC ingot. The SiC ingot is obtained, for example, by a sublimation method.

Figure 6:
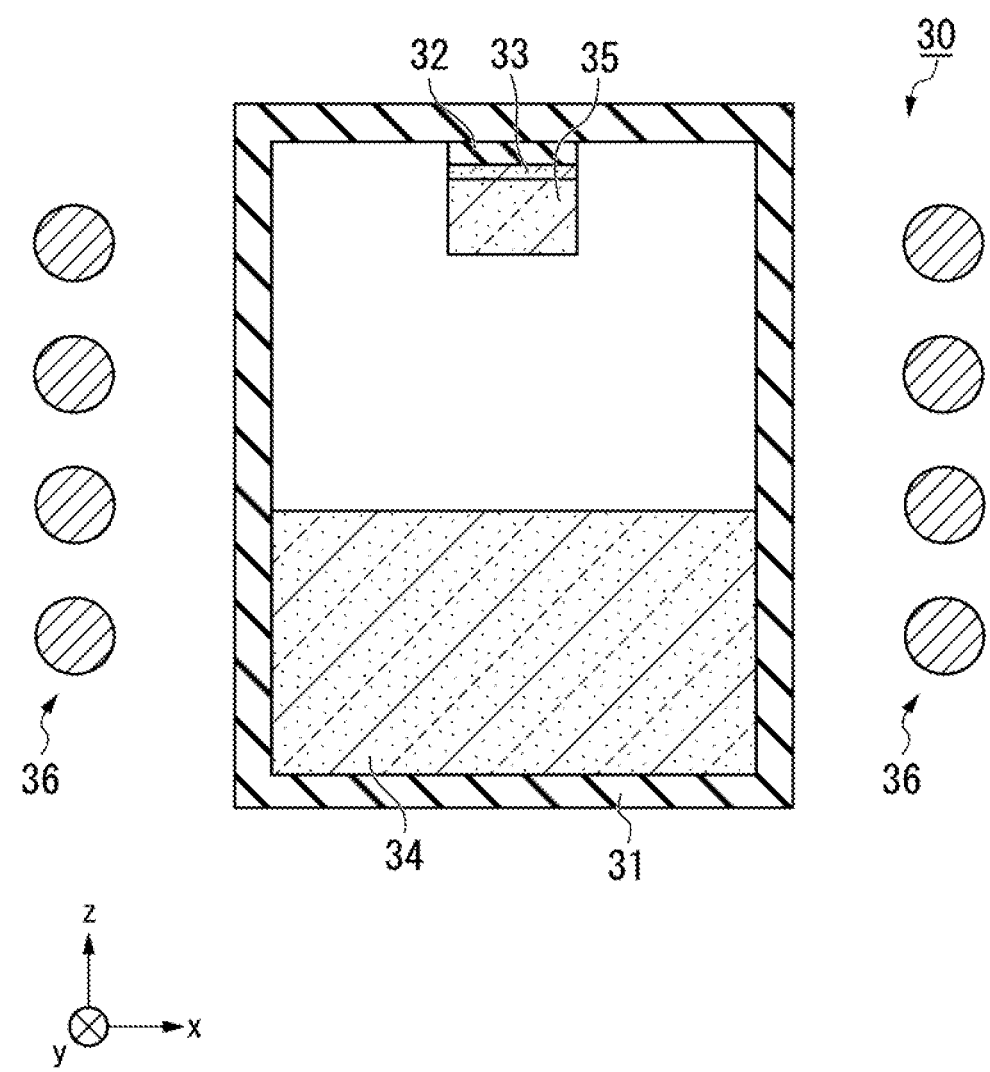
FIG. 6 is a schematic diagram showing a sublimation method, which is an example of a SiC ingot manufacturing apparatus.

FIG. 6 is a schematic diagram showing a sublimation method, which is an example of a SiC ingot manufacturing apparatus 30. In FIG. 6, a direction orthogonal to a surface of a pedestal 32 is defined as a z direction, one direction orthogonal to the z-direction is defined as an x direction, and a direction orthogonal to the z direction and the x direction is defined as a y direction.

The sublimation method is a method for disposing a seed crystal 33 formed of SiC single crystal on the pedestal 32 disposed in a crucible 31 formed of graphite, heating the crucible 31 to supply a sublimation gas sublimated from a raw material powder 34 in the crucible 31 to the seed crystal 33, and growing the seed crystal 33 into a larger SiC ingot 35. The heating of the crucible 31 is performed by a coil 36, for example.

By controlling crystal growth conditions in the sublimation method, the bow and the warp of the SiC substrate 10 obtained from the SiC ingot 35 can be controlled.

For example, in a case of performing c plane growth of the SiC ingot 35, the temperature of a center part of a crystal growth surface and the temperature of an outer peripheral part are controlled. The crystal growth surface is a surface during a growth process of the crystal. For example, in a case of performing the c plane growth of the SiC ingot 35, the temperature of the outer peripheral part is reduced to be lower than the temperature of the center part of the crystal growth surface. In addition, the crystal growth is performed so that a difference in growth speed between the center and the outer periphery in an xy plane is 0.001 mm/h or more and 0.05 mm/h or less. Here, the growth speed of in the center in the xy plane is reduced to be slower than the growth speed of the outer periphery. The growth speed is changed by changing the temperature of the crystal growth surface.

The temperature of the crystal growth surface can be adjusted by controlling a position of a heating center of the crucible 31 due to the coil 36 in the z direction. The position of the heating center of the crucible 31 in the z direction can be changed by changing the position of the coil 36 in the z direction. The position of the heating center of the crucible 31 in the z direction and the position of the crystal growth surface in the z direction are controlled to be separated by 0.5 mm/h. Here, the position of the heating center of the crucible 31 in the z direction is controlled to be on a lower side (a side of the raw material powder 34) with respect to the position of the crystal growth surface in the z direction.

Next, the SiC ingot 35 manufactured under such conditions is processed into the SiC substrate 10. In a general processing method, the stress applied to the single crystal changes depending on a state of the SiC ingot 35 and a state of the SiC substrate 10. For example, in a shaping step, when processing the SiC ingot 35 having a diameter of 180 mm into the SiC substrate 10 having a diameter of 150 mm, it is necessary to reduce the diameter. In addition, for example, in a multi-wire cutting step, undulations occur on the surface, and it is necessary to remove the undulations. Through such a step, for example, a part of the SiC ingot 35 having a large stress may be removed or a shape of a crystal lattice surface is changed, and the stress of the state of the SiC ingot 35 may be released in the state of the SiC substrate 10. The SiC substrate 10 is processed to take the stress applied to the single crystal in the state of the SiC ingot 35. The stress applied to the SiC substrate 10 is one of the factors of the deflection of the SiC substrate 10, and the deflection of the SiC substrate can be adjusted by adjusting the stress. As a result, it is possible to suppress the deflection of the SiC substrate 10 by using the stress transferred to the SiC substrate 10.

For example, after performing damage-free processing on one surface of the SiC ingot 35, it is cut with a single wire saw, and the damage-free-processed surface is adsorbed to further perform the damage-free processing on the cut surface. By performing the damage-free processing on both surfaces of the SiC substrate 10, a part of the stress generated in the state of the SiC ingot is transferred to the SiC substrate 10. The damage-free processing is, for example, CMP processing. By performing substrate processing to remain a lattice surface shape of the state of the SiC ingot 35, the stress of the SiC ingot 35 is transferred to the SiC substrate 10. After that, a shaping step of adjusting the diameter is performed, thereby adjusting the deflection of the SiC substrate 10.

As described above, by manufacturing the SiC substrate 10 using the manufacturing method described above, it is possible to reduce the bow and the warp in a case of the inner peripheral support. In addition, by manufacturing the SiC substrate 10 using the manufacturing method described above, it is also possible to reduce the bow and the warp in a case of the outer peripheral support.

Since the SiC substrate 10 according to the present embodiment is manufactured to satisfy predetermined conditions, the bow and the warp in a case of the inner peripheral support are small. Therefore, even in a case of the internal support, the transport errors are less likely to occur. In addition, the SiC substrate 10 having a small bow and a small warp in a case of the outer peripheral support, is less likely to cause the transport errors and has high versatility for processes, in both cases of the inner peripheral support and the outer peripheral support.

Second Embodiment

Figure 7:
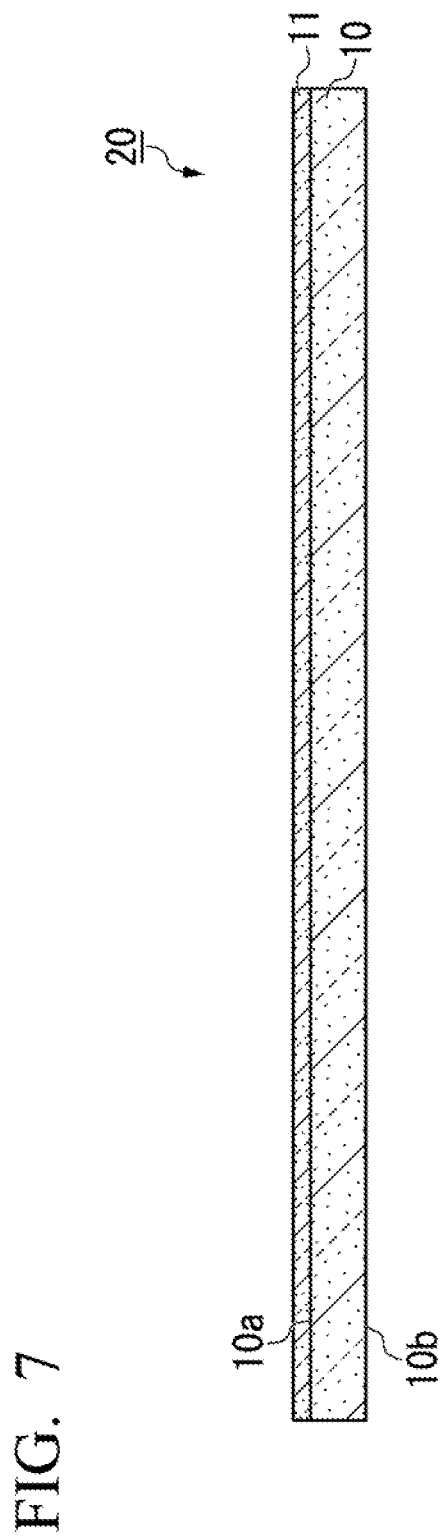
FIG. 7 is a cross-sectional view of a SiC epitaxial wafer according to the present embodiment.

FIG. 7 is a cross-sectional view of the SiC epitaxial wafer 20 according to a second embodiment. The SiC epitaxial wafer 20 includes the SiC substrate 10 and the SiC epitaxial layer 11. The SiC epitaxial layer 11 is stacked on one surface of the SiC substrate 10. The SiC epitaxial layer 11 is, for example, stacked on the upper surface 10a of the SiC substrate 10.

The SiC epitaxial layer 11 is stacked on the SiC substrate 10 in order to obtain high-quality SiC on which a device can operate. In addition, mechanical processing such as polishing is often performed before stacking the SiC epitaxial layer 11. In this case, a work-affected layer is formed on the upper surface 10a of the SiC substrate 10. The SiC epitaxial wafer 20 may warp, in a case where the SiC epitaxial layer 11 is stacked or the work-affected layer is formed on one surface of the SiC substrate 10.

A surface of the SiC substrate 10 is often ground. A surface roughness (Ra) of the upper surface 10a of the SiC substrate 10 is preferably, for example, 1 nm or less. The upper surface 10a is, for example, a surface on which the SiC epitaxial layer 11 is stacked.

Both of the upper surface 10a and a lower surface 10b of the SiC substrate 10 may be ground. The upper surface 10a is, for example, a Si surface, and the lower surface 10b is, for example, a C surface. The relationship between the upper surface 10a and the lower surface 10b may be reversed. Both the upper surface 10a and the lower surface 10b may be mirror-finished mirror surfaces with residual scratches or the like, or may be CMP-processed surfaces subjected to chemical mechanical Polishing (CMP), and the polishing degree may be different between the upper surface 10a and the lower surface 10b. The work-affected layer is formed on the mirror surface with residual scratches or the like, and almost no work-affected layer is formed on the CMP-processed surface. The work-affected layer is a part that has been damaged by processing and has a collapsed crystal structure.

For example, in a case where the upper surface 10a is a mirror-ground surface and the lower surface 10b is a CMP-processed surface, the Twyman effect occurs in the SiC substrate 10 due to a difference in surface state between the two surfaces. The Twyman effect is a phenomenon in which, in a case where there is a difference occurs in residual stress on both surfaces of a substrate, a force acts to compensate for the difference in stress on both sides. The Twyman effect may cause the warpage of the SiC epitaxial wafer 20.

In addition, the SiC epitaxial wafer 20 after stacking the SiC epitaxial layer 11 also has the warp of preferably 50 µm or less and more preferably 30 µm or less. In addition, the SiC epitaxial wafer 20 after stacking the SiC epitaxial layer 11 also has the bow in a case of the inner peripheral support of preferably 30 µm or less and more preferably 10 µm or less. In addition, the bow in a case of the outer peripheral support is preferably −30 µm or more.

Since the warp and the bow of the SiC substrate 10 are within the predetermined ranges, the SiC epitaxial wafer 20 according to the second embodiment is less likely to deflect even after the SiC epitaxial layer 11 is stacked. Therefore, the SiC epitaxial wafer 20 is also less likely to cause the transport errors.

Although the preferred embodiments of the present invention have been described in detail above, the present invention is not limited to specific embodiments, and can be variously modified and changed within the gist of the present invention described in claims.

EXAMPLES

Example 1

The SiC ingot 35 was manufactured by a sublimation method. When manufacturing the SiC ingot 35, the position of the heating center of the crucible 31 in the z direction and the position of the crystal growth surface in the z direction were controlled to be separated by 0.5 mm/h. The temperature of the outer peripheral part was lowered than the temperature of a center part of the crystal growth surface, and the crystal growth was performed so that the difference in growth speed between the center and the outer periphery in an xy plane was 0.001 mm/h or more and 0.05 mm/h or less.

Then, the manufactured SiC ingot 35 was cut with a multi-wire saw, and both surfaces were CMP-polished. The SiC substrate 10 having a plate thickness of 348.15 μm and a diameter of 150 mm was prepared through the above step.

The manufactured SiC substrate 10 was supported by a plurality of inner peripheral support surfaces 1 arranged on a circumference having a radius of 17.5 mm from the center C, and the bow and the warp were measured. The bow was 9.468 μm. The warp was 18.416 μm.

Then, this SiC substrate 10 was transported along a predetermined transportation path. The height of the transportation path was set to 2 mm. In addition, the thickness of a robot hand in the transportation path was set to 1.5 mm, the stroke width was set to 50 μm, and the upper limit of the thickness of a wafer to be transported was set to 375 μm. When the plurality of SiC substrates 10 of Example 1 were transported under these conditions, the transport error rate of the SiC substrate 10 of Example 1 was 0%.

Example 2

In Example 2, the growth conditions for manufacturing the SiC ingot 35 were the same, but the thickness of the cut SiC substrate 10 was different from that in Example 1. When manufacturing the SiC substrate 10 in Example 2, the temperature of the outer peripheral part was lowered than the temperature of a center part of the crystal growth surface, the difference in growth speed between the center and the outer periphery in the xy plane was set to 0.001 mm/h or more and 0.05 mm/h or less, and the position of the heating center of the crucible 31 in the z direction and the position of the crystal growth surface in the z direction were controlled to be separated by 0.5 mm/h.

In addition, in the same manner as in Example 1, the SiC substrate 10 of Example 2 was supported by the inner peripheral support surface 1, and the bow and the warp were measured. The bow in a case where the SiC substrate 10 was supported by the inner peripheral support surface 1 was 35.744 μm, and the warp was 51.174 μm. Under the same conditions as in Example 1, the transport error rate when the SiC substrate 10 of Example 2 was transported was 20%.

Comparative Example 1, Comparative Example 2

Comparative Examples 1 and 2 were different from Example 1 in that the growth conditions for manufacturing the SiC ingot 35 were changed. In Comparative Examples 1 and 2, the temperature condition during the crystal growth was not particularly controlled.

In addition, in the same manner as in Example 1, the bow and the warp were measured in a case where the SiC substrate 10 of Comparative Examples 1 and 2 was supported by the inner peripheral support surface 1.

The bow in a case where the SiC substrate 10 of Comparative Example 1 was supported by the inner peripheral support surface 1 was 74.027 μm, and the warp was 103.705 μm. Under the same conditions as in Example 1, the transport error rate when the SiC substrate 10 of Comparative Example 1 was transported was 100%.

The bow in a case where the SiC substrate 10 of Comparative Example 2 was supported by the inner peripheral support surface 1 was −30.164 μm, and the warp was 282.608 μm. Under the same conditions as in Example 1, the transport error rate when the SiC substrate 10 of Comparative Example 2 was transported was 100%.

The results of Examples 1 and 2 and Comparative Examples 1 and 2 were summarized in Table 1 below.

TABLE 1

|  | Diameter (mm) | Plate thickness (μm) | Inner peripheral support | | Transport error ratio |
|---|---|---|---|---|---|
|  |  |  | Bow (μm) | Warp (μm) |  |
| Example 1 | 150 | 348.15 | 9.468 | 18.416 | 0% |
| Example 2 | 150 | 341.061 | 35.744 | 51.174 | 20% |
| Comparative Example 1 | 150 | 345.618 | 74.027 | 103.705 | 100% |
| Comparative Example 2 | 150 | 350.271 | −30.164 | 282.608 | 100% |

In Examples 1 and 2, in which the temperature during manufacturing was precisely controlled, the bow and the warp were small even in a case of the inner peripheral support. In addition, the SiC substrate of Examples 1 and 2 having a small bow and a small warp had a lower transport error rate than the SiC substrate of Comparative Examples 1 and 2. Further, each of the bow and the warp of Example 1 was smaller than each of the bow and the warp of Example 2. In Example 1, the plate thickness of the SiC substrate 10 was thicker than that in Example 2. The bow and the warp can be reduced by increasing the plate thickness.

EXPLANATION OF REFERENCES 1 inner peripheral support surface
2 outer peripheral support surface
10 SiC substrate
10a upper surface
10b lower surface
11 SiC epitaxial layer
20 SiC epitaxial wafer
30 manufacturing apparatus
31 crucible
32 pedestal
33 seed crystal
34 raw material powder
35 SiC ingot
36 coil
C center
F flat surface
hp highest point
lp lowest point
p1 first point
p2 second point
S1 first plane
S2 second plane
S3 third plane
Sr1 first reference plane
Sr2 second reference plane

What is claimed is:
1. A SiC substrate,
wherein, in a case where the SiC substrate is supported on an inner periphery by an inner peripheral support surface positioned to overlap a circumference having a radius of 17.5 mm from a center, the SiC substrate deflects upward, in a case where a plane connecting first points of an upper surface overlapping the inner peripheral support surface when seen in a thickness direction is defined as a first reference plane, and an upper side of the first reference plane is defined as a positive side, a bow is less than 40 μm and a diameter is 145 mm or more.

2. The SiC substrate according to claim 1,
wherein a warp in a case where the SiC substrate is supported by the inner peripheral support surface is less than 60 μm.

3. The SiC substrate according to claim 1,
wherein, in a case where the SiC substrate is supported on an outer periphery by an outer peripheral support surface positioned to overlap a circumference 7.5 mm inside from an outermost periphery, in a case where a plane connecting second points of the upper surface overlapping the outer peripheral support surface when seen in the thickness direction is defined as a second reference plane, and an upper side of the second reference plane is defined as a positive side, a bow is more than −40 μm.

4. The SiC substrate according to claim 3,
wherein, in a case where the SiC substrate is supported on the outer periphery by the outer peripheral support surface, a bow with respect to the second reference plane is 0 μm or less.

5. The SiC substrate according to claim 3,
wherein a warp in a case where the SiC substrate is supported by the outer peripheral support surface is less than 60 μm.

6. The SiC substrate according to claim 1,
wherein a diameter is 195145 mm or more.

7. A SiC epitaxial wafer comprising:
the SiC substrate according to claim 1; and
a SiC epitaxial layer stacked on one surface of the SiC substrate.

8. The SiC substrate according to claim 1,
wherein the bow in a case where the SiC substrate is supported by the inner peripheral support surface is less than 10 μm.

9. The SiC substrate according to claim 1,
wherein a warp in a case where the SiC substrate is supported by the inner peripheral support surface is less than 20 μm.

10. A SiC epitaxial wafer comprising:
the SiC substrate according to claim 2; and
a SiC epitaxial layer stacked on one surface of the SiC substrate.

11. A SiC epitaxial wafer comprising:
the SiC substrate according to claim 3; and
a SiC epitaxial layer stacked on one surface of the SiC substrate.

12. A SiC epitaxial wafer comprising:
the SiC substrate according to claim 4; and
a SiC epitaxial layer stacked on one surface of the SiC substrate.

13. A SiC epitaxial wafer comprising:
the SiC substrate according to claim 5; and
a SiC epitaxial layer stacked on one surface of the SiC substrate.

14. A SiC epitaxial wafer comprising:
the SiC substrate according to claim 6; and
a SiC epitaxial layer stacked on one surface of the SiC substrate.

15. A SiC epitaxial wafer comprising:
the SiC substrate according to claim 8; and
a SiC epitaxial layer stacked on one surface of the SiC substrate.

16. A SiC epitaxial wafer comprising:
the SiC substrate according to claim 9; and
a SiC epitaxial layer stacked on one surface of the SiC substrate.

* * * * *